United States Patent
Wang

(10) Patent No.: US 7,940,501 B2
(45) Date of Patent: *May 10, 2011

(54) SYSTEM AND METHOD TO RELIEVE ESD REQUIREMENTS OF NMOS TRANSISTORS

(75) Inventor: Hongwei Wang, Fremont, CA (US)

(73) Assignee: Broadcom Corporation, Irvine, CA (US)

(*) Notice: Subject to any disclaimer, the term of this patent is extended or adjusted under 35 U.S.C. 154(b) by 20 days.

This patent is subject to a terminal disclaimer.

(21) Appl. No.: 12/410,965

(22) Filed: Mar. 25, 2009

(65) Prior Publication Data

US 2009/0185318 A1    Jul. 23, 2009

Related U.S. Application Data

(63) Continuation of application No. 10/668,249, filed on Sep. 24, 2003, now Pat. No. 7,515,390.

(51) Int. Cl.
*H02H 3/22* (2006.01)
(52) U.S. Cl. ............................ 361/56; 361/111
(58) Field of Classification Search ............... 361/56, 361/111
See application file for complete search history.

(56) References Cited

U.S. PATENT DOCUMENTS

| | | | |
|---|---|---|---|
| 3,746,946 A | 7/1973 | Clark | |
| 5,361,185 A | 11/1994 | Yu | |
| 5,499,152 A | 3/1996 | Tamakoshi | |
| 5,784,242 A | 7/1998 | Watt | |
| 5,869,870 A | 2/1999 | Lin | |
| 5,917,689 A | 6/1999 | English et al. | |
| 6,304,423 B1 | 10/2001 | Long et al. | |
| 6,522,511 B1 | 2/2003 | John et al. | |
| 6,566,717 B2 | 5/2003 | Jung | |
| 7,515,390 B2 * | 4/2009 | Wang | 361/56 |

* cited by examiner

*Primary Examiner* — Danny Nguyen
(74) *Attorney, Agent, or Firm* — Sterne, Kessler, Goldstein & Fox P.L.L.C.

(57) ABSTRACT

A system and method relieves ESD requirements on devices in circuits of chips that are susceptible to being damaged from ESD through an external pad. For example, one of the devices can be NMOS transistors having drains (or sources) connected to the external pad(s) and no (or significantly small) current flows from their drains (or sources) to the corresponding pad(s). In order to protect such a device, an ESD protecting system is coupled between the NMOS device and the pad. The ESD protecting system can include an n-type transistor or a p-type transistor.

19 Claims, 5 Drawing Sheets

SYSTEM AND METHOD TO RELIEVE ESD REQUIREMENTS OF NMOS TRANSISTORS

CROSS REFERENCE TO RELATED APPLICATIONS

The present application is a continuation of U.S. application Ser. No. 10/668,249, filed Sep. 24, 2003 now U.S. Pat. No. 7,515,390, which is incorporated herein by reference in its entirety.

BACKGROUND OF THE INVENTION

1. Field of the Invention

The present invention is related to compensating for electrostatic discharge (ESD) accumulated at external pads.

2. Background Art

Chips are coupled to other chips via external pads. The external pads develop ESD over time. If this ESD current flows into the chip, one or more devices within the chip can be damaged. In particular, n-type transistors (e.g., n-type metal oxide silicon (NMOS) field effect transistors) are typically more susceptible than other devices to being damaged if they are directly connected to the pad.

Therefore, what is needed is a system and method that protects devices on a chip from being damaged by ESD current flowing into the chip from an external pad.

BRIEF SUMMARY OF THE INVENTION

Embodiments of the present invention provide a method and system including a circuit, an electrostatic discharge (ESD) protection system, and a pad. The ESD protection system substantially prevents ESD from damaging the internal devices (e.g., n-type or NMOS transistors) in the circuit.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
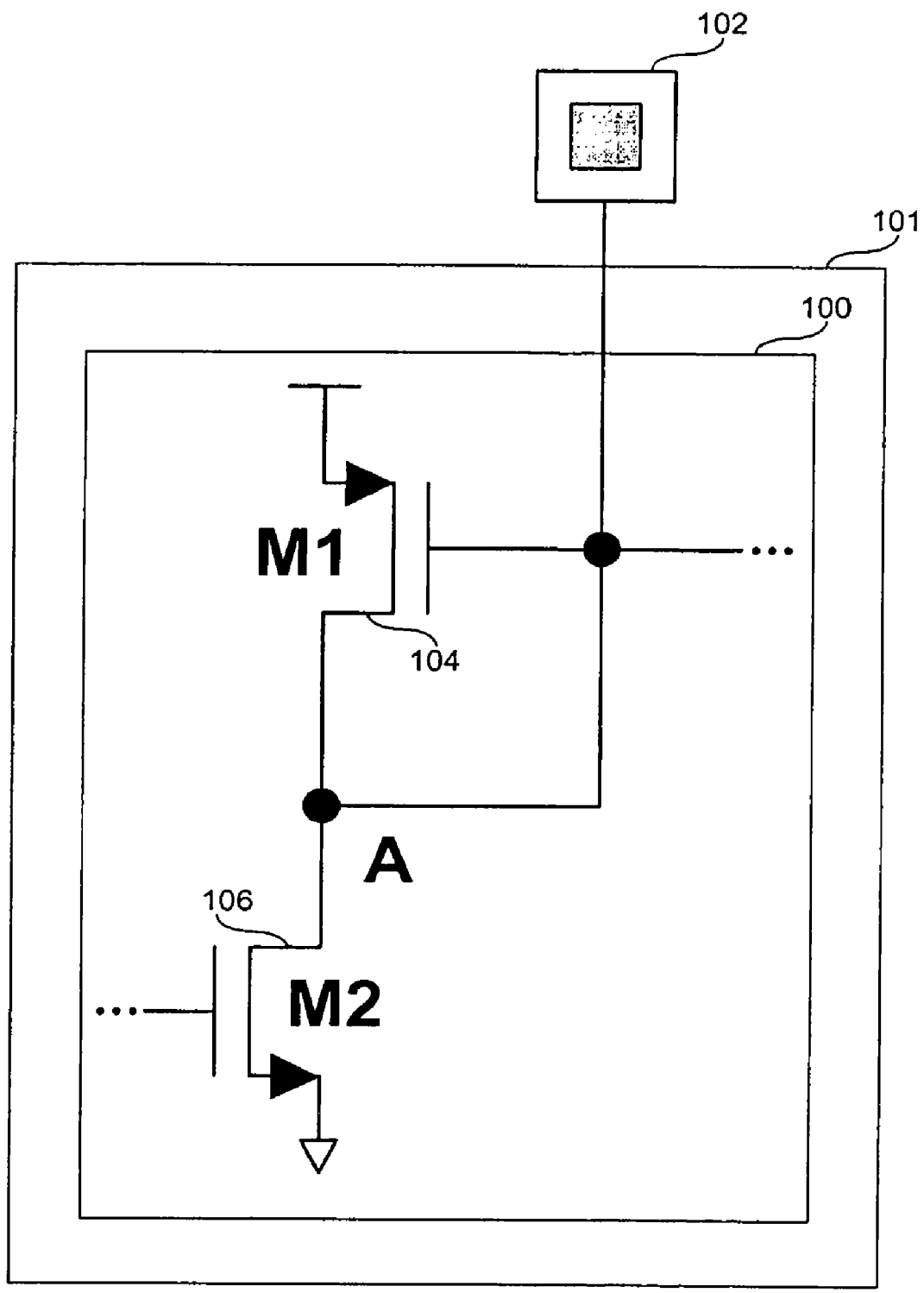
FIG. 1 is a schematic diagram of a portion of chip having a circuit coupled to an external pad.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 is a schematic diagram of a portion of a circuit 100 in a chip 101 coupled to an external pad 102. The portion of circuit 100 includes a first device 104 (e.g., a PMOS transistor M1) in series connection with a second device 106 (e.g., an NMOS transistor M2). A drain of M2 106 is coupled to a drain and gate of M1 104 at node A. External pad 102 is also coupled to node A.

Therefore, M2 106 needs to meet ESD requirements. For example, a minimum drain-contact-to-gate distance of M2 106 may be required as part of a layout design rule. If M2 106 is already required to be a relatively large device because of operating parameter, cost of the chip can be increased because of a significantly large silicon area being required for M2 106. Merely as an example, if an operational requirement required M2 106 to be 200 µm×8 µm, adding the ESD requirement can increase M2 106 size to 400 µm×8 µm or higher.

Embodiments of the present invention provide a system and method of relieving a ESD requirements on devices in circuits of chips that are susceptible to being damaged from ESD on an external pad. For example, one of the devices can be NMOS transistors having drains (or sources) connected to the external pad(s) and no (or significantly small) current flows from their drains (or sources) to the corresponding pad(s). In order to protect such a device, an ESD protecting system is coupled between the NMOS device and the pad.

ESD Protection Systems

Circuit devices, such as resistors, related to an EDS protection system are not shown in FIGS. 2-5 for simplicity, although they are usually included in the actual circuit if a transistor gate is connected to an external pad.

Figure 2:
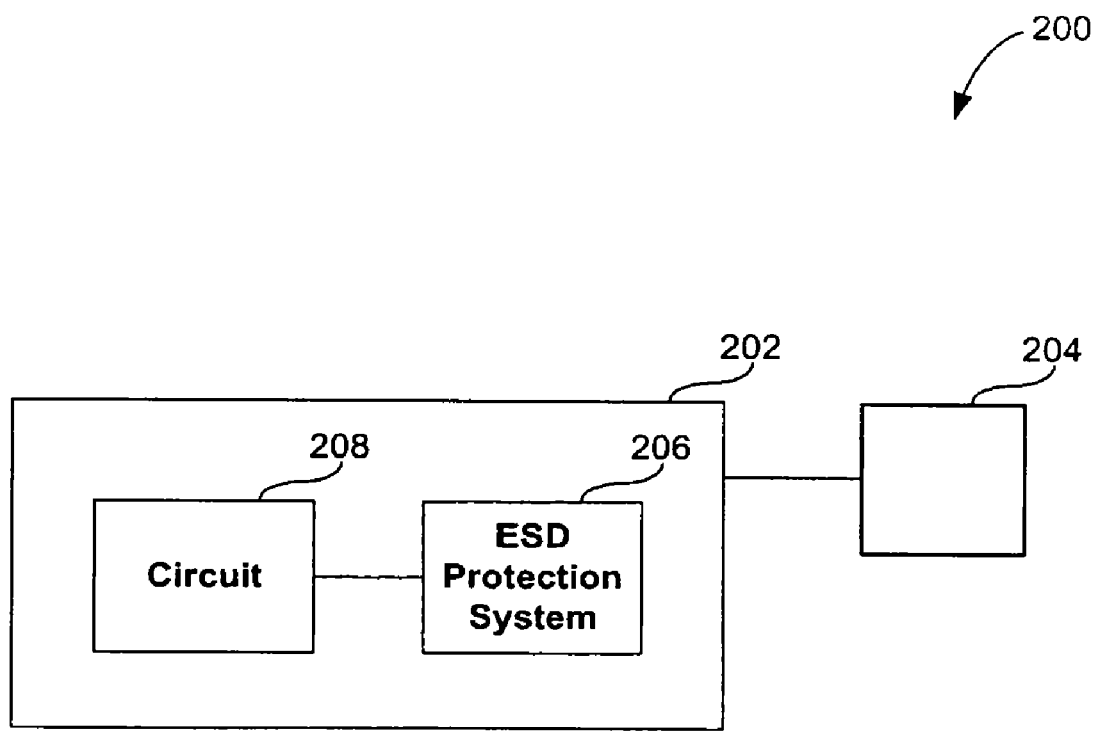
FIG. 2 is a block diagram of a system having an ESD protection system between a circuit and an external pad according to embodiments of the present invention.
Figure 3:
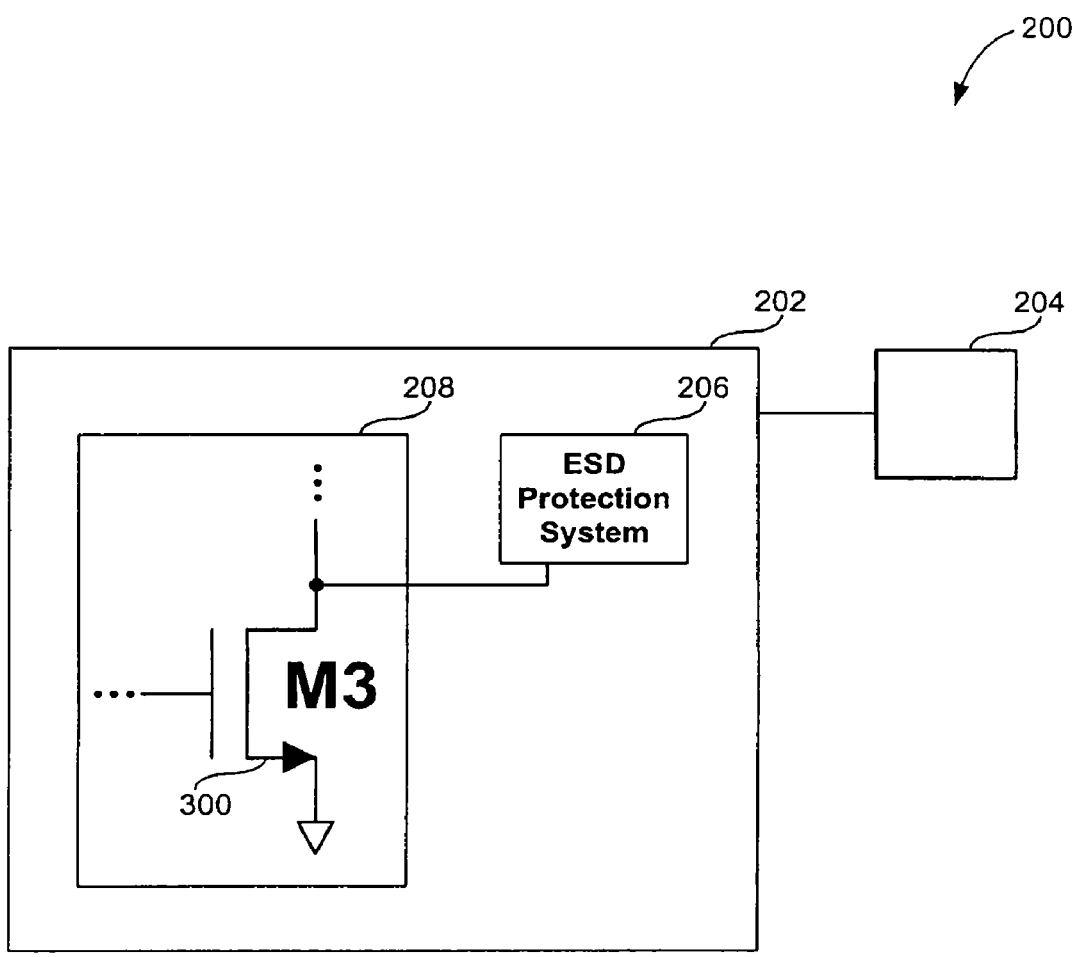
FIG. 3 shows an exemplary circuit element coupled to the ESD protection system in FIG. 2 according to embodiments of the present invention.

FIGS. 2-3 are block diagrams showing a system 200 according to embodiments of the present invention. System 200 includes a chip 202 coupled to an external pad 204. Chip 202 can have an ESD protection system 206 (e.g., a resistor, a transistor, a circuit, or the like) coupled between a circuit 208 and pad 204. Circuit 202 can have at least an n-type transistor M3 300 (e.g., an NMOS transistor) coupled to pad 204 at its drain (or source) via ESD protection system 206. In this embodiment, ESD protection system 206 isolates M3 300 from pad 204, substantially preventing all flow of ESD current from pad 204 to M3 300 to protect M3 300 from being damaged. This substantially relaxes ESD requirements on M3 300, saving both silicon space and money compared to M1 106 in FIG. 1.

Figure 4:
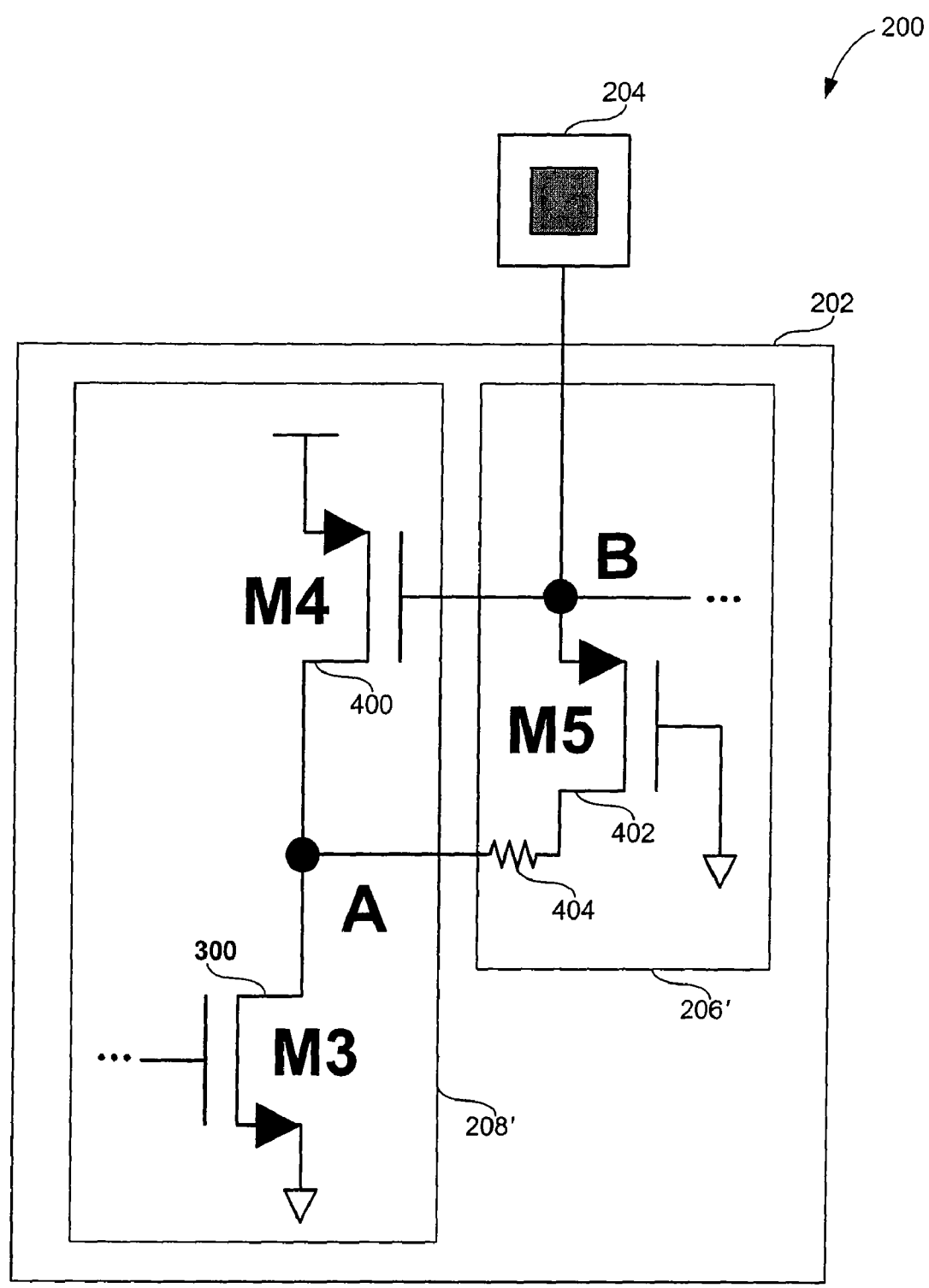
FIGS. 4 and 5 show various circuit elements and elements in the ESD protection system in FIG. 2 according to various embodiments of the present invention.

FIG. 4 is a schematic diagram of system 200 according to an embodiment of the present invention. Circuit 208' includes M3 300 coupled in series with a p-type transistor M4 400 (e.g., a PMOS transistor), whose drains are coupled to a node A. ESD protection system 206' includes a PMOS transistor M5 402 with its gate coupled to ground and which is coupled between node A and a node B. Pad 204 and a gate of M4 400 are also coupled to node B.

In this configuration, M5 402 isolates the drain of M3 300 from pad 204 to substantially prevent any ESD current at pad 204 from directly flowing into the drain of M3 300. A size of M3 300 added to a size of M5 402 is substantially less than a size of M2 106, as shown by the example below. This is at least partially because PMOS devices are less susceptible to ESD, so they do not need a larger size to prevent damage. Also, M5 402 does not need to meet any operational specifications, so it can be only large enough to protect M3 300 from ESD.

Figure 5:
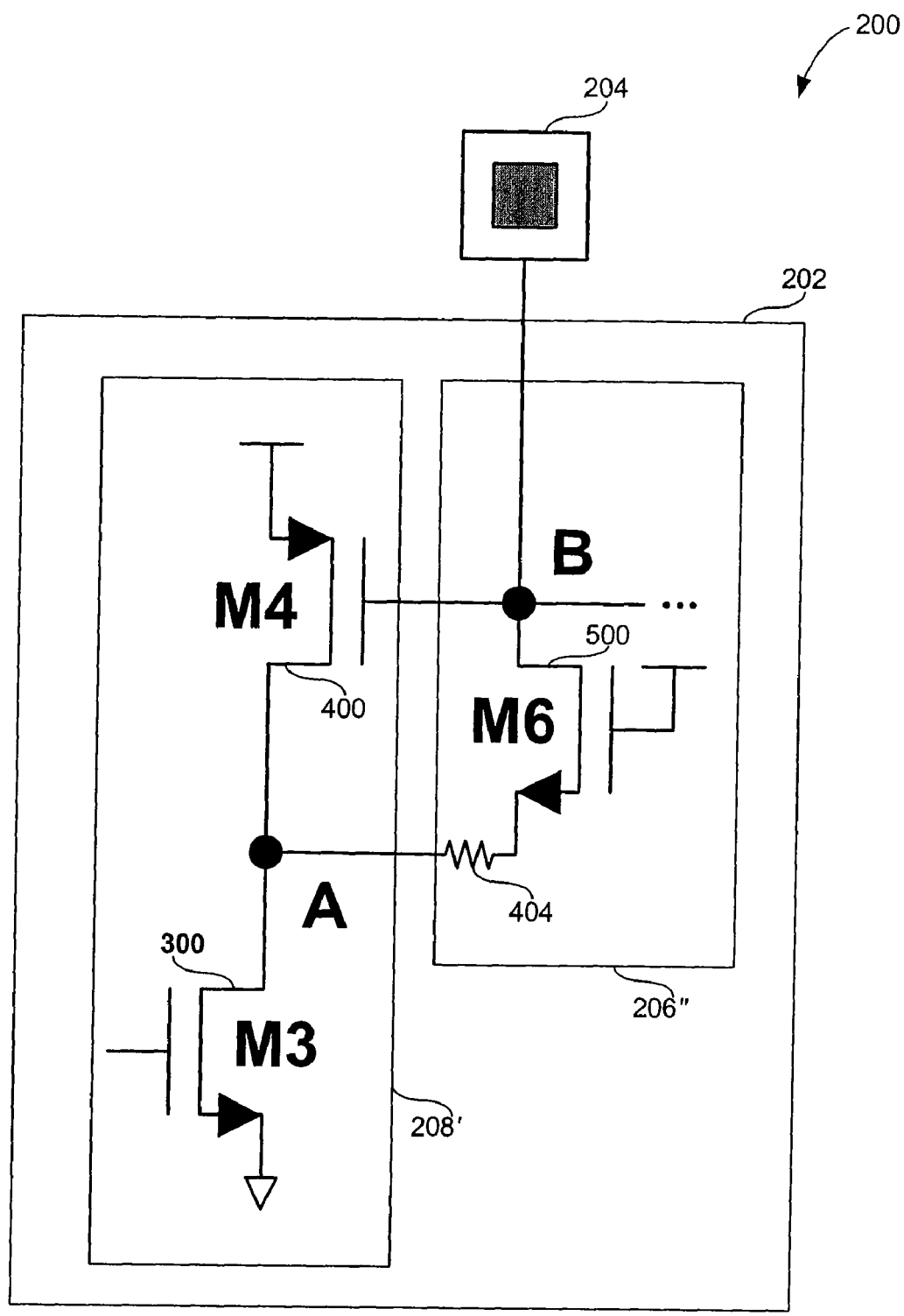

FIG. 5 is a schematic diagram of system 200 according to an embodiment of the present invention. A main difference between FIGS. 4 and 5 is that ESD protection system 206" includes an NMOS transistor M6 500 with its gate coupled to a power supply (not shown), which replaces M5 402 in ESD protection system 206'. In this configuration, M6 500 isolates the drain of M3 300 from pad 204 to substantially prevent any ESD current at pad 204 from directly flowing into the drain of M3 300. A size of M3 300 added to a size of M5 500 is substantially less than a size of M2 106, as shown by the example below. This is because M6 500 does not need to meet any operational specifications, so it can be only large enough to protect itself and M3 300 from ESD.

In one exemplary embodiment, operational requirements may specify M3 300 be 200 µm×8 µm, as discussed above. ESD requirements may specify M5 402 (or M6 500) be 2 µm×2 µm or M6 500 be 4 µm×2 µm. Thus, even if an area of M3 300 and M5 402 or M3 300 and M6 500 were combined, the combined silicon area would be much less than the required silicon area of 400 µm×8 µm (or higher, as discussed above) for M2 106 when having to comply with both operational and ESD requirements.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system comprising:
a circuit comprising an n-type transistor, the n-type transistor adapted to comply with an operational requirement;
an electrostatic discharge (ESD) protection system adapted to withstand an ESD event; and
a pad,
wherein the ESD protection system is coupled between the pad and the n-type transistor, and substantially eliminates ESD from flowing from the pad into the n-type transistor, and the area of the n-type transistor and the area of the ESD protection system collectively are less than the area of a single n-type transistor adapted to comply with the operational requirement and to withstand the ESD event.

2. The system of claim 1, wherein the circuit further comprises a PMOS transistor.

3. The system of claim 1, wherein the ESD protection system comprises a resistor.

4. The system of claim 1, wherein the ESD protection system comprises a n-type transistor.

5. The system of claim 1, wherein the ESD protection system comprises an NMOS transistor.

6. The system of claim 1, wherein the ESD protection system comprises a p-type transistor.

7. The system of claim 1, wherein the ESD protection system comprises a PMOS transistor.

8. The system of claim 1, wherein the area of the n-type transistor adapted to comply with the operational requirement and the area of the EDS protection system are collectively less than 400 µm×8 µm.

9. A system comprising:
a pad;
a circuit comprising an n-type transistor, the n-type transistor adapted to comply with an operational requirement; and
means for protecting the circuit adapted to withstand an ESD event, coupled between the pad and the n-type transistor, configured to substantially eliminate ESD from flowing to the n-type transistor from the pad;
wherein the area of the n-type transistor and the area of the means for protecting the circuit collectively are less than the area of a single n-type transistor adapted to comply with the operational requirement and to withstand the ESD event.

10. The system of claim 9, wherein the circuit further comprises a PMOS transistor.

11. The system of claim 9, wherein the means for protecting comprises a resistor.

12. The system of claim 9, wherein the means for protecting comprises a n-type transistor.

13. The system of claim 9, wherein the means for protecting comprises an NMOS transistor.

14. The system of claim 9, wherein the means for protecting comprises a p-type transistor.

15. The system of claim 9, wherein the means for protecting comprises a PMOS transistor.

16. The system of claim 9, wherein the area of the n-type transistor adapted to comply with the operational requirement and the area of the means for protecting the circuit are collectively less than 400 µm×8 µm.

17. A system comprising:
a circuit comprising an n-type transistor, the n-type transistor adapted to comply with an operational requirement;
one of a NMOS transistor and a PMOS transistor system adapted to withstand an ESD event; and
a pad,
wherein the one of the NMOS transistor and the PMOS transistor is coupled between the pad and the n-type transistor, and substantially eliminates ESD from flowing from the pad into the n-type transistor, and the area of the n-type transistor and the area of the one of the NMOS transistor and the PMOS transistor collectively are less than the area of a single n-type transistor adapted to comply with the operational requirement and to withstand the ESD event.

18. The system of claim 17, wherein the area of the n-type transistor adapted to comply with the operational requirement and the area of the one of the NMOS transistor and the PMOS transistor are collectively less than 400 µm×8 µm.

19. The system of claim 17, wherein the circuit further comprises a second PMOS transistor.

* * * * *